United States Patent [19]
Ando

[11] Patent Number: 4,710,704
[45] Date of Patent: Dec. 1, 1987

[54] IC TEST EQUIPMENT

[75] Inventor: Masakazu Ando, Gyoda, Japan

[73] Assignee: Advantest Corporation, Tokyo, Japan

[21] Appl. No.: 787,032

[22] Filed: Oct. 15, 1985

[30] Foreign Application Priority Data

Oct. 15, 1984 [JP] Japan ............................ 59-155218[U]

[51] Int. Cl.⁴ .......................................... G01R 31/28
[52] U.S. Cl. .................................... 324/73 R; 371/25
[58] Field of Search ........... 324/73 R, 73 AT, 73 PC, 324/103 P; 371/25, 27

[56] References Cited

U.S. PATENT DOCUMENTS 3,842,345 10/1974 Padgitt et al. .................... 324/103 P
4,497,056 1/1985 Sugamori ........................ 324/73 R Primary Examiner—Ernest F. Karlsen
Attorney, Agent, or Firm—Staas & Halsey

[57] ABSTRACT

A test pattern is supplied to the IC under test and a current corresponding to the power supply current of the IC is obtained from a current converter. A reference current reverse in polarity from the output current of the current converter is yielded from a reference current source. The output currents of the current converter and the reference current source are supplied to an integrating capacitor via first and second switches, respectively. The first and second switches are simultaneously turned ON in synchronism with the test pattern and held in the ON state in a specified phase for a specified period in one operation cycle. The voltage of the integrating capacitor immediately after turning-OFF of the first and second switches is compared with a reference voltage and the comparison result is output. After the outputting of the comparison result and before the turning-ON of the first and second switches the voltage of the integrating capacitor is reset by reset means to the reference voltage.

17 Claims, 7 Drawing Figures

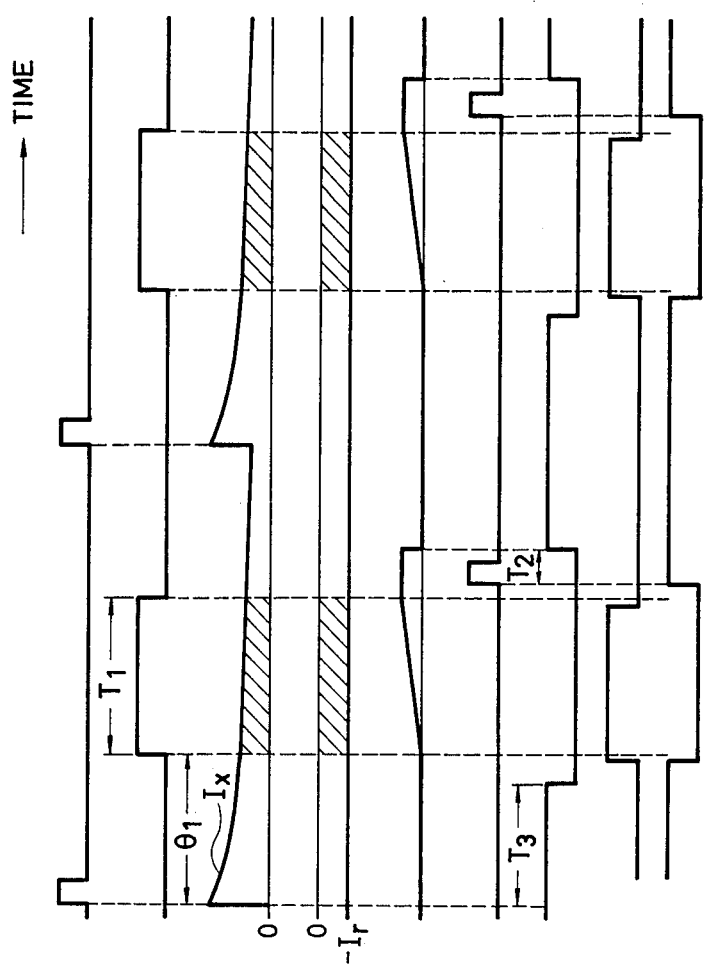

IC TEST EQUIPMENT

BACKGROUND OF THE INVENTION

The present invention relates to IC test equipment of the type that supplies a test pattern to an IC under test and compares its operating current with a reference one.

Conventional IC test equipment of this kind perform the test by applying a test pattern to the IC under test and checking whether or not a mean value of its power supply current dissipated over tens of its operating cycles is greater than a predetermined value. According to the IC under test, however, the operating power supply current may sometimes vary within one operation cycle. For example, when a logic circuitry IC, which operates on a plurality of logic signals, goes to logic "1" state at its many parts in one cycle, a large current flows, but in another cycle in which it goes to logic "0" state at many parts, the current flow is small; thus, the power supply current varies for each cycle. Also in a memory IC, when it is addressed, the power supply current increases temporarily and the current flow differs with the state in which the IC is addressed. In the case of a C-MOS IC, when it goes from logic "1" state to logic "0" state or vice versa, a pair of FETs which perform a complementary operation are both turned ON instantaneously, causing a pulsewise increase in the power supply current.

As mentioned above, various semiconductor integrated circuits may sometimes be subject to variations in the power supply current within one operation cycle and this often affects the characteristics of the IC under test.

As referred to above, however, there has not been conducted a test for checking whether or not current dissipated for a certain period in each operation cycle is within a predetermined value. One possible technique for such a test based on the prior art is as follows: As shown in FIG. 1, a test pattern is supplied from a test pattern generator 21 to an IC under test 22, which operates with the cycle of the test pattern. The IC under test 22 is also supplied with its operating power from a power source terminal 23. For detecting the operating power, a current detecting resistor 24 of a small resistance value is connected between the power source terminal 23 and a power source terminal of the IC under test 22, and the resistor 24 is connected at both ends to a voltage-current converter 25. Across the resistor 24 is induced a voltage which is proportional to the instantaneous value of a current Io flowing from the power source terminal 23 to the IC under test 22, and the instantaneous value of the voltage is converted to a current Ix. Accordingly, the current Ix corresponds to the instantaneous operating current Io of the IC under test 22. The current Ix is charged in a capacitor 12 via a switch 11. The capacitor 12 is temporarily shorted via a switch 13 at the start of each operation cycle so that charges stored in the capacitor 12 are discharged therefrom, presetting it to zero potential. The switch 11 is held in the ON state in a predetermined phase for a predetermined period in each operation cycle. In consequence, charges corresponding to an integrated value of the current Io which flows into the IC under test 22 from the power source terminal 23 during the ON state of the switch 11 is stored in the capacitor 12. The voltage of the capacitor 12 is compared by a comparator 15 with a reference voltage Er of a reference voltage source 14. When the voltage of the capacitor 12 exceeds the reference voltage Er, the output of the comparator 15 goes high, whereas when the voltage of the capacitor 12 is lower than the reference voltage Er, the output of the comparator 15 remains low. The output of the comparator 15 is input by a strobe pulse into a D flip-flop 34 after turning-OFF of the switch 11 but before turning-ON of the switch 13. If the output of the flip-flop 34 is high-level, then it is displayed, for instance, on a display (not shown), that the IC under test is defective. In the alternative, the output of the flip-flop 34 is stored in a memory for each operation cycle for an analysis of defectives. The test pattern generator 21 supplies a control circuit 16 with a clock synchronized with the start of each operation cycle, and the control circuit 16 creates control signals for the switches 11 and 13 and the strobe pulse for the flip-flop 34.

With such an arrangement, it can be checked whether or not current dissipated in a specified period of each operation cycle exceeds a reference value. But this arrangement cannot make a correct test unless the capacitor 12 is highly precise and stable in its capacitance value. Such a high-precision, high-stability capacitor is extremely expensive. Furthermore, if the comparator 15 has an offset voltage, since the sum of the offset voltage and the reference voltage Er is compared with the voltage of the capacitor 12, the comparator 12 will provide an inaccurate comparison result correspondingly.

SUMMARY OF THE INVENTION

It is therefore an object of the present invention to provide an IC test equipment which is able to test an IC as to whether or not a mean value of its operating current (current consumption) in a predetermined period of its operation cycle is greater than a reference value.

Another object of the present invention is to provide an IC test equipment which is capable of accurately testing an IC as to whether its mean operating current consumed for a predetermined period in each of several operation cycles is greater than a reference value and which is easy to fabricate at low cost.

In accordance with the present invention, the power supply current of the IC under test is converted by a current converter to the corresponding current, and a reference current reverse in polarity from the output current of the current converter is created by a reference current source. The outputs of the current converter and the reference current source are supplied to an integrating capacitor via first and second switches, respectively. The first and second switches are controlled in synchronism with a test pattern. After completion of their ON-state period, the voltage of the integrating capacitor and a reference voltage are compared by a comparator, from which the compared output is provided. Then the voltage of the integrating capacitor is reset by resetting means to the reference voltage, with the first and second switches held open.

In this way, a current corresponding to the difference between the reference current and the current corresponding to the current to be checked are charged in the integrating capacitor for only a preset period, and the voltage of the integrating capacitor is compared with the reference voltage. Since the voltage of the integrating capacitor is reset to the reference voltage at the start of comparison, a correct comparing operation can be achieved regardless of the precision of the capacitance value of the integrating capacitor, its voltage fluctuations owing to a leak current or the offset voltage of the comparator.

BRIEF DESCRIPTION OF THE DRAWINGS

FIGS. 5A through 5H are a series of timing charts showing, by way of example, waveforms occurring at respective parts of the equipment of FIG. 2, for explaining its operation;

DESCRIPTION OF THE PREFERRED EMBODIMENTS

Figure 2:
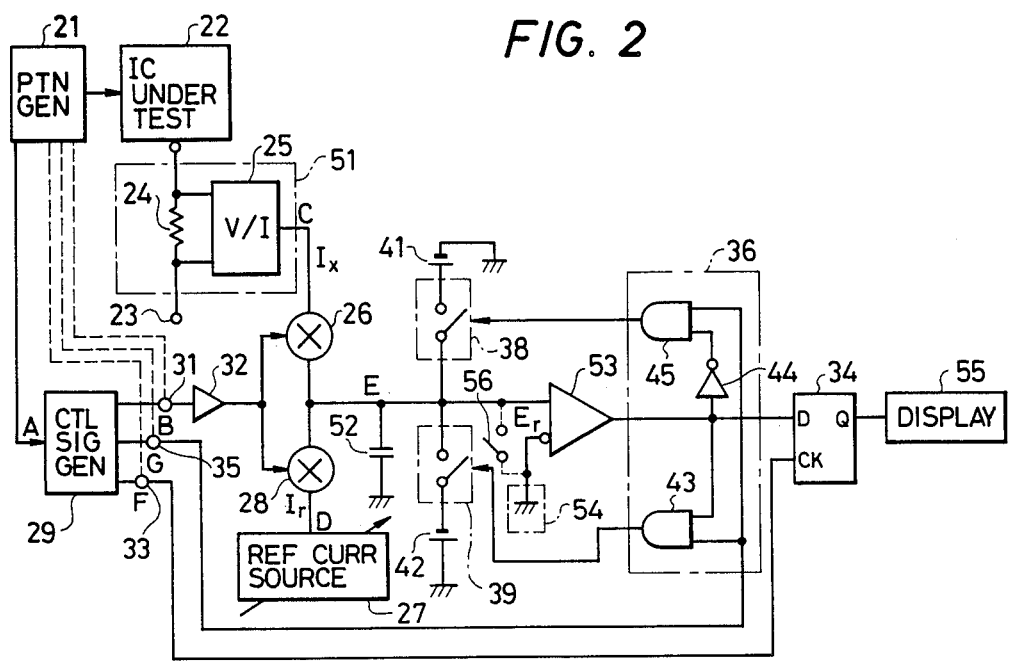
FIG. 2 is a circuit diagram illustrating an example of the IC test equipment of the present invention.

Now, a description will be given of an embodiment of the IC test equipment according to the present invention. In Fig. 2, a test pattern is provided from the test pattern generator 21 to the IC under test 22. The test pattern generator 21 and other general arrangements of the IC test equipment are disclosed in, for example, U.S. Pat. No. 4,497,056 which issued on Jan. 29, 1985. The IC under test 22 operates with the cycle of the test pattern. The IC under test 22 is supplied with operating power from the power source terminal 23. The difference between the operating current Ix to the IC under test 22 and a reference current Ir is detected as an integrated voltage value E which is obtained in a specified phase for a specified period during the operation cycle of the IC under test 22, and it is compared with the reference voltage value Er.

Figure 3:
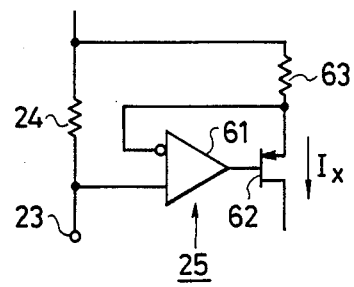
FIG. 3 is a circuit diagram showing a specific operative example of a voltage-current converter 25 used in FIG. 2.

To this end, in this embodiment the current detecting resistor 24 of a small resistance value is connected in series between the power source terminal 23 and the power source terminal of the IC under test 22, and the voltage-current converter 25 is connected across the resistor 24. The output current Ix of the voltage-current converter 25 is supplied via a switch 26 to an integrating capacitor 52. The current detecting resistor 24 and the voltage-current converter 25 constitute a current converter 51. The voltage-current converter 25 has such a construction, for instance, as shown in FIG. 3. In FIG. 3, the power source terminal 23 side of the current detecting resistor 24 is connected to a non-inverting input end of an operational amplifier 61. The output end of the operational amplifier 61 is connected to the gate of a P-channel FET 62, which has its source connected to an inverting input end of the operational amplifier 61 and via a resistor 63 to the other end of the current detecting resistor 24. The current Ix flows through the resistor 63 so that voltage drops across the resistors 24 and 63 become equal to each other, and the current Ix is delivered from the drain of the FET 62 to the switch 26 in FIG. 2.

Figure 4:
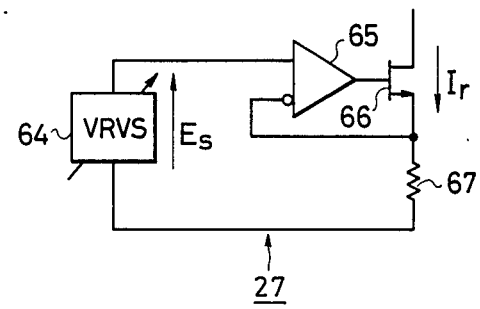
FIG. 4 is a circuit diagram showing a specific operative example of a reference current source 27 employed in FIG. 2.

In FIG. 2, a reference current source 27 is provided which generates the reference current Ir reverse in polarity from the output current Ix of the voltage-current converter 25. The reference current source 27 is arranged so that its reference current Ir can be altered. For example, as depicted in FIG. 4, one end of a variable reference voltage source 64 is connected to a non-inverting input end of an operational amplifier 65, the output end of which is connected to the gate of an N-channel FET 66. The source of the FET 66 is connected to an inverting input end of the operational amplifier 65 and via a resistor 67 to the other end of the variable voltage source 64. The variable reference voltage source 64 outputs a set reference voltage Es, and the current Ir flows through the resistor 67 so that the voltage drop thereacross becomes equal to the reference voltage Es. The current Ir flows in from the outside via the drain of the FET 66, that is, it flows as a negative current. The converted current Ix output from the voltage-current converter 25 is a positive current which flows out of the converter 25, and this current and the reference current Ir are made reverse in polarity. When changing the setting of the variable reference voltage source 64 to alter the magnitude of the reference voltage Es emanating therefrom, the magnitude of the reference current Ir also varies correspondingly.

In FIG. 2, the reference current Ir from the reference current source 27 is provided via a switch 28 to the integrating capacitor 52. The reference current Ir is one that is equal in magnitude to but opposite in polarity from a mean value of the current Ix which is yielded from the voltage-current converter 25 in a specified phase for a specified period of the operation cycle of the IC under test 22 when it has desired characteristics, that is, for a period in which it is desired to perform the current detection. The switches 26 and 28 are analog switches which are usually formed by bipolar transistors or FETs, and they are simultaneously subjected to ON-OFF control.

Accordingly, when the current Ix from the voltage-current converter 25 to the integrating capacitor 52 is equal in magnitude but reverse in polarity from the reference current Ir from the reference current source 27, no charging of the integrating capacitor 52 will take place. However, when for instance the current Ix is larger in absolute value than the reference current Ir, charges in the integrating capacitor 52 increase with the polarity of the current Ix in accordance with the difference between the absolute values of the currents Ix and Ir, raising the voltage of the integrating capacitor 52 in terms of absolute value. Conversely, when the reference current Ir is larger in absolute value than the output current Ix of the voltage-current converter 25, the voltage of the integrating capacitor 52 rises with the polarity of the reference current Ir in accordance with the difference in absolute value between the currents Ir and Ix.

The test pattern generator 21 supplies a control signal generator 29 with a reference clock which is synchronized with the start of the cycle of the test pattern, such, for example, as depicted in FIG. 5A. The control signal generator 29 derives at its terminal 31 a switch control signal which has a phase $\theta_1$ and a pulse width $T_1$ relative to the reference clock, as shown in FIG. 5B. The switch control signal is applied as a control signal via a buffer (a switch drive circuit) 32 to each of the switches 26 and 28 to hold it in the ON state for the duration of the control signal. Accordingly, in the case where the IC under test 22 operates in response to a test pattern applied thereto and its operating current varies with the operation and then the corresponding current Ix is yielded from the voltage-current converter 25, for example, as shown in FIG. 5C, the current Ix is supplied to the integrating capacitor 52 for the duration $T_1$ of the switch control signal. On the other hand, the reference current Ir is similarly provided from the reference current source 27 via the switch 28 to the integrating capacitor 52 for the period $T_1$. The currents Ix and Ir are reverse in polarity from each other. For instance, when the current Ix is larger than the current Ir in terms of absolute value, the voltage of the integrating capacitor 52 gradually increases, as depicted in FIG. 5E.

The voltage E of the integrating capacitor 52 is compared by a comparator 53 with a reference voltage Er of a reference voltage source 54. In this example, ground potential, i.e. zero volt, is used as the reference voltage Er. A strobe pulse is provided from a terminal 33 of the control signal generator 29 to a clock terminal of a D flip-flop 34 immediately after the fall of the switch control signal (FIG. 5B), as shown in FIG. 5F, by which the output of the comparator 53 is read into the D flip-flop 34 and the comparison result is provided to a display 55. That is, when the output of the comparator 53 is high-level, the IC under test 22 is displayed, for instance, as defective, on the display 55.

During the time interval between the moment immediately after the fall of the strobe pulse and the moment immediately before the generation of the next switch control signal, such a reset signal as shown in FIG. 5G is applied from a terminal 35 of the control signal generator 29 to a switch control circuit 36. The output of the comparator 53 is also applied to the switch control circuit 36, by the output of which one of switches 38 and 39 is turned ON and the other OFF. A positive voltage source 41, which creates a voltage higher than the reference voltage Er of the reference voltage source 54, is connected via the switch 38 to the integrating capacitor 52. A negative voltage source 42, which generates a voltage lower than the reference voltage Er of the reference voltage source 54, is connected via the switch 39 to the integrating capacitor 52.

The output of the comparator 53 is provided to an AND circuit 43 and via an inverter 44 to an AND circuit 45. The AND circuits 43 and 45 are each supplied with the reset signal from the terminal 35 of the control signal generator 29. The switches 38 and 39 are controlled by the outputs of the AND circuits 43 and 45, respectively.

As described previously, the voltage E of the integrating capacitor 52 and the reference voltage Er of the reference voltage source 54 are compared by the comparator 53, and the comparison result is read by the strobe pulse (FIG. 5F) into the flip-flop 34. Immediately thereafter the reset signal (FIG. 5G) is produced, which is applied to the AND circuit 43 and 45 to reset the integrating capacitor 52. For example, when the output of the comparator 53 is high-level in the integrating capacitor resetting state, that is, when the voltage E of the integrating capacitor 52 is higher than the reference voltage Er, the output of the AND circuit 43 goes high to turn ON the switch 39 and OFF the switch 38. Then, the negative voltage source 42 is connected via the switch 39 to the integrating capacitor 52, decreasing its voltage E. As a result of this, when the voltage E of the integrating capacitor 52 drops lower than the reference voltage Er and the output of the comparator 53 goes low-level, the output of the AND circuit 45 rises to the high level, turning ON the switch 38 and OFF the switch 39. Consequently, the integrating capacitor 52 is charged by the positive voltage source 41, raising its voltage E. When the voltage E of the integrating capacitor 52 rises again in excess of the reference voltage Er, the output of the comparator 53 goes high-level, turning ON the switch 39 and OFF the switch 38.

In this way, the voltage E of the integrating capacitor 52 is decreased when it is slightly higher than the reference voltage Er, and is increased when it is slightly lower than the voltage Er. By repeating this operation, the voltage E of the integrating capacitor 52 is maintained substantially equal to the reference voltage Er, that is, it is held in the reset state. With such control, the voltage E of the integrating capacitor 52 can be made to approach the reference voltage Er with a precision of, for example, less than 10 millivolts. When the integrating capacitor 52 is in its reset state, its voltage E substantially agrees with the reference voltage Er in view of an offset voltage of the comparator 53, and when the reference voltage Er is zero volt, the integrating capacitor 52 is charged to a value equal to the offset voltage. Therefore, when the reset signal disappears and the switches 26 and 28 are turned ON by the switch control signal and then the comparing operation takes place, the comparison result is correctly decided with an error of, for instance, less than 10 millivolts.

Since the resetting of the integrating capacitor 52 is to make its voltage E equal to the reference voltage Er, it is also possible to connect a short-circuit switch 56 between the two input ends of the comparator 53, as indicated by the broken line in FIG. 2, and to turn it ON by the reset signal. In this instance, no compensation for the offset voltage of the comparator 53 takes place.

Figure 6:
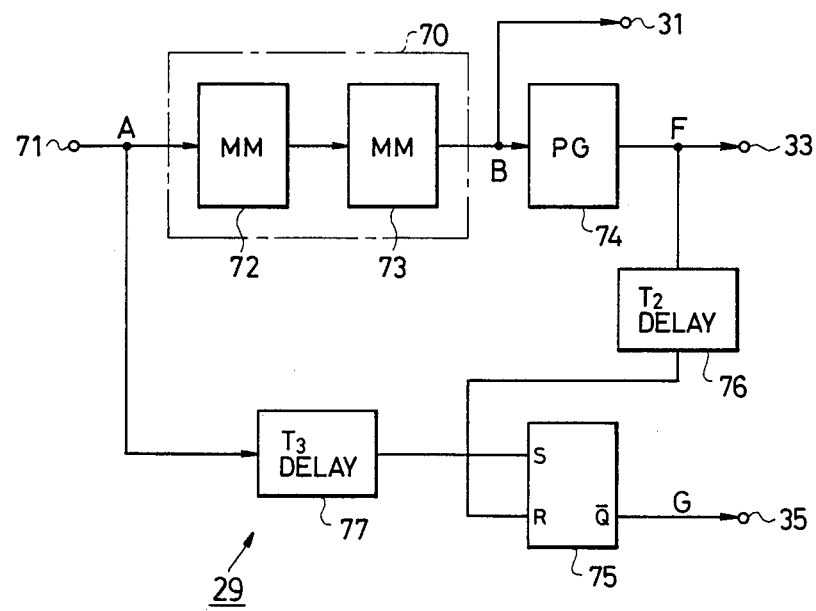
FIG. 6 is a block diagram illustrating a specific operative example of a control signal generator 29.

The control signal generator 29 is usually incorporated in the test pattern generator 21. The control signal generator 29 is arranged so that it sets the phase $\theta_1$ and the pulse width $T_1$ relative to the reference clock to generate the switch signal of a desired phase and a desired pulse width and to automatically create the strobe signal and the reset signal correspondingly. For example, as shown in FIG. 6, such a reference clock as depicted in FIG. 5A is applied to a terminal 71. The reference clock can be obtained from, for instance, a period determining circuit 65 of a timing generator 1 in FIG. 5 of the aforementioned United States patent. A monostable multivibrator 72 of a switch control signal generator 70 is driven by the reference clock, and its output immediately rises and then falls after an elapsed time corresponding to the phase $\theta_1$ being set. The output of the monostable multivibrator 72 is applied to another monostable multivibrator 73 to drive it, and its output rises at the fall of the output from the monostable multivibrator 72 and then falls after the lapse of the time $T_1$ being set, thereby producing the switch control signal shown in FIG. 5B. The phase $\theta_1$ and the pulse width $T_1$ can be set by adjusting the time constants of the monostable multivibrators 72 and 73, respectively. The output of the monostable multivibrator 73 is provided to a pulse generator 74 to produce the strobe pulse which rises slightly after the fall of the output of the monostable multivibrator 73, as depicted in FIG. 5F. The strobe pulse is delayed by a delay circuit 76 for a time $T_2$ and is then applied to a reset terminal of a flip-flop 75. The flip-flop 75 is reset by the positive-going edge of the delayed strobe pulse and its Q output rises, as shown in FIG. 5G, and is used as the reset signal. The reference clock at the terminal 71 is delayed by a delay circuit 77 for a time $T_3$, and its delayed output is applied to the flip-flop 75, setting it.

Figure 1:
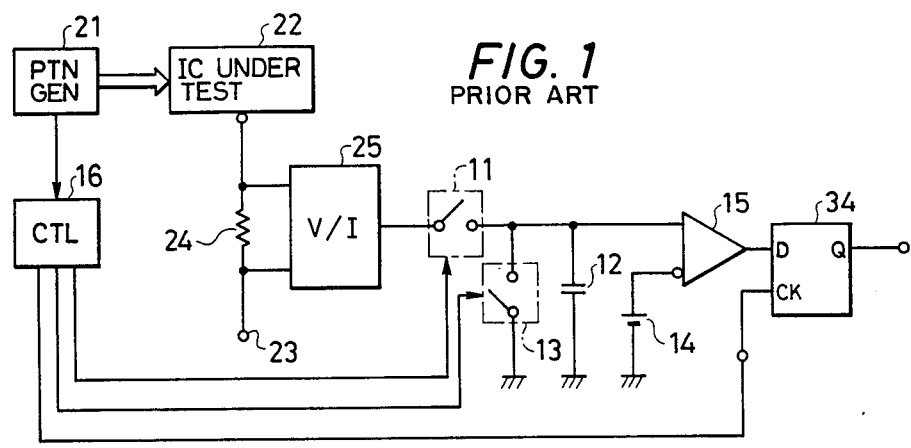
FIG. 1 is a circuit diagram illustrating IC test equipment which is possible with the prior art.

Since the test pattern generator 21 in FIG. 2 is capable of creating various test patterns, it is also possible to produce all or some of the switch control signal, the reset signal and the strobe pulse by utilizing a part of the test pattern signal being generated and to supply them to the terminals 31, 35 and 33, as indicated by the broken lines in FIG. 2. This can be implemented in such a manner, for example, as follows. In FIG. 1 of the aforementioned United States patent, by disconnecting the outputs of three of drivers $8_1$ to $8_n$ from the IC under test and setting respective parts of a timing selector 14, a pattern generator 3 and a waveform formatter 6 for the three drivers, it is possible to derive the switch control signal, the reset signal and the strobe pulse of desired patterns at the three driver outputs.

Furthermore, the switch control signal may also be produced by obtaining, as one of test pattern outputs, a clock which slightly leads the switch control signal (FIG. 5B), as shown in FIG. 5H, and then merely delaying the clock with the switch control signal generator 70. Moreover, the reset signal may also be obtained as shown in FIG. 5G' by setting the flip-flop 75 by the positive-going edge of the clock shown in FIG. 5H and then resetting the flip-flop 75 by the strobe pulse.

Figure 7:
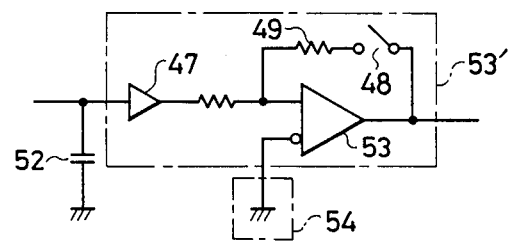
FIG. 7 is a circuit diagram showing a specific operative arrangement including a comparator 53 and the associated circuit elements.

When the comparator 53 has a relatively small input impedance, it is preferable to insert a buffer circuit 47 of a high input impedance in the preceding stage of the comparator 53, as depicted in FIG. 7, so as to prevent the charges stored in the integrating capacitor 52 from being supplied to the comparator 53. This ensures that the comparator 53 achieves a high-precision comparison without being affected by the charges stored in the integrating capacitor 52. The voltage interval of the repetitive ON-OFF control of the switches 38 and 39 in FIG. 2 can be adjusted by interconnecting the output side and the non-inverting input side of the comparator 53 via a reset switch 48 and a resistor 49, suitably setting the resistance value of the resistor 49 and turning ON the switch 48 so that the comparator 53 has a hysteresis characteristic. The switch 48 is turned ON by the reset signal and, during the comparison operation, it is held in the OFF state.

The positive and negative voltage sources 41 and 42 may also be substituted with positive and negative current sources, respectively. When such current sources are employed, the switches 38 and 39 are formed by current switches, which are easier to design than the voltage switches. It is also possible to detect not only whether the current dissipated in a specified period during one operation cycle of the IC under test 22 is smaller or larger than the reference value but also whether the current dissipated during one or more operation cycles of the IC 22 is smaller or larger than the reference value.

As described above, according to the present invention, the power supply current of the IC under test 22 during its operation is converted to the current Ix, by means of the current converter 51 made up of the current detecting resistor 24 and the voltage-current converter 25. By turning ON the switches 26 and 28 in the phase and for the period which are set in synchronism with a test pattern, the current Ix and the reference current Ir reverse in polarity therefrom are simultaneously provided to the integrating capacitor 52 for the set period. Since the integrating capacitor 52 is charged corresponding to the difference between the current values, the currents Ix and Ir can be compared in terms of magnitude regardless of the capacitance of the integrating capacitor 52. Besides, in the above embodiment, since the integrating capacitor 52 is always reset before turning-ON of the switches 26 and 28 so that its voltage E is equal to the reference voltage Er including the offset voltage of the comparator 53, even if the comparator 53 has the offset voltage, a correct detection can be achieved without being affected by the offset voltage.

It will be apparent that many modifications and variations may be effected without departing from the scope of the novel concepts of the present invention.

What is claimed is:

1. IC test equipment connected to receive a reference voltage and comprising:
    a test pattern generator for generating a test pattern;
    a current converter for converting a power supply current of the IC under test to a corresponding current;
    a reference current source for producing a reference current reverse in polarity from said output current of the current converter;
    an integrating capacitor;
    first and second switches, connected between said integrating capacitor and said current converter and connected between said integrating capacitor and said reference current source, respectively;
    a switch drive circuit, connected to said first and second switches, for providing a switch control signal for simultaneously controlling said first and second switches to open and close in synchronism with said test pattern;
    a comparator, connected to said integrating capacitor and connected to receive the reference voltage, for comparing the voltage of said integrating capacitor and the reference voltage, and for providing a corresponding output;
    reset means, connected to said integrating capacitor, for generating a reset signal and making the voltage of the integrating capacitor equal to the reference voltage when the first and second switches are open, said reset means including:
        a positive power source and a negative power source, connected to said integrating capacitor, said positive power source increasing the voltage across said integrating capacitor and said negative power source reducing the voltage across said integrating capacitor;
        third and fourth switches connected to said positive and negative power sources, respectively, and to said integrating capacitor; and
        switch control means, connected to said comparator, for receiving said reset signal and the output from said comparator, and selectively turning on one of said third and fourth switches in accordance with the comparison between the voltage of said integrating capacitor and the reference voltage, when the voltage of said integrating capacitor is higher than the reference voltage said fourth switch is turned on and when the voltage of said integrating capacitor is lower than the reference voltage said third switch is turned on;
    a flip-flop, operatively connected to said comparator and said reset means, for receiving the output of said comparator during a time interval between the turning-OFF of said first and second switches and a resetting of the flip-flop by the reset means; and
    control signal generating means, connected to said switch drive circuit, said reset means, said test pattern generator and said flip-flop, for generating the switch control signal, the reset signal and a strobe pulse in synchronism with said test pattern.

2. IC test equipment according to claim 1 wherein the reference current source is a variable current source capable of creating a desired reference current.

3. IC test equipment according to claim 1 wherein the control signal generating means comprises:
 a circuit for receiving a reference clock and producing, as the switch control signal, a pulse having a set pulse width and a set phase relative to the reference clock, the reference clock occurring within the same period and phase as said test pattern from said test pattern generator;
 a pulse generator, connected to said switch drive circuit, for receiving the switch control signal, and producing, as the strobe pulse, a pulse slightly delayed behind the fall of the switch control signal; and
 a circuit, connected to receive the reference clock and the strobe pulse, for operating on the reference clock and the strobe pulse for producing the reset signal during the time interval between the strobe pulse and the switch control signal.

4. IC test equipment according to claim 1 wherein the control signal generating means is a means for generating at least one of the switch control signal, the reset signal and the strobe pulse as a part of the test pattern signal emanating from the test pattern generator.

5. IC test equipment according to claim 1 wherein the control signal generating means is a means for generating at least one of the switch control signal, the reset signal and the strobe pulse as a part of the test pattern signal emanating from the test pattern generator.

6. IC test equipment according to claim 1 wherein the positive power source is a positive current source and the negative power source is a negative current source.

7. IC test equipment according to claim 1 wherein the comparator includes means driven by the reset signal for providing a hysteresis characteristic during the occurrence of the reset signal.

8. IC test equipment according to claim 1 wherein the control signal generating means comprises a circuit which receives, as a clock, one part of the test pattern from the test pattern generator and delays it to produce the switch control signal, a circuit which receives the switch control signal to generate the strobe pulse, and a flip-flop which is controlled by the clock and the strobe pulse to produce the reset signal.

9. IC test equipment according to claim 5, wherein the reference current source is a variable current source capable of creating a desired reference current.

10. IC test equipment according to claim 6, wherein the reference current source is a variable current source capable of creating a desired reference current.

11. IC test equipment according to claim 7, wherein the reference current source is a variable current source capable of creating a desired reference current.

12. IC test equipment according to claim 8, wherein the reference current source is a variable current source capable of creating a desired reference current.

13. IC test equipment according to claim 1, wherein said positive power source is a positive voltage source and said negative power source is a negative voltage source.

14. A device connected to receive a reference voltage, comprising:
 test pattern means for successively providing test patterns in a succession of test periods to an integrated circuit under test while successively outputting a test signal corresponding to the power consumed during each of said test periods by said integrated circuit under test in response to said test patterns;
 integrating capacitor means, connected to said test pattern means, for receiving said test signal from said test pattern means and integrating said test signal during at least a part of each of said test periods to obtain an integrated signal, said integrated signal corresponding to power consumed during at least the part of said test;
 comparison means, connected to said integrating capacitor means and connected to receive the reference voltage, for comparing the integrated signal with the reference voltage and providing a comparison output signal corresponding to the results of the comparison operation;
 data receiving means, connected to said comparison means, for receiving the comparison output signal; and
 reset means, connected to said integrating capacitor means, for resetting the voltage on said integrating capacitor means to a value corresponding to the reference voltage during the integration of said at least part of said test period, said reset means including:
  a positive power source, connected to said integrating capacitor means, for charging said integrating capacitor means;
  a negative power source, connected to said integrating capacitor means, for reducing the voltage on said integrating capacitor;
  first and second switches connected between said positive and negative power sources and said integrating capacitor means, respectively; and
  switch control means, connected to said first and second switches, for selectively turning on one of said first and second switches in dependence upon whether the voltage of said integrating capacitor means is higher or lower than the reference voltage, respectively, said control means selecting said second switch when the voltage on said integrating capacitor means is higher than the reference voltage, and said control means selecting said first switch when the voltage on said integrating capacitor means is lower than the reference voltage.

15. The device of claim 14, wherein said reset means resets the signal level on said terminal to compensate for any offset of said comparator.

16. The device of claim 14, wherein each said integrated value is for a predetermined part of each respective test period.

17. The device of claim 14 wherein each said comparison is for an integrated value corresponding to a plurality of test periods.

* * * * *